United States Patent [19]
Okazaki

[11] Patent Number: 4,827,454
[45] Date of Patent: May 2, 1989

[54] SEMICONDUCTOR MEMORY DEVICE
[75] Inventor: Nobumichi Okazaki, Kanagawa, Japan
[73] Assignee: Sony Corporation, Tokyo, Japan
[21] Appl. No.: 89,772
[22] Filed: Aug. 27, 1987
[30] Foreign Application Priority Data
  Sep. 25, 1986 [JP] Japan .................... 61-227351
[51] Int. Cl.$^4$ .............................. G11C 8/00
[52] U.S. Cl. ..................... 365/233.5; 365/206; 365/189.05
[58] Field of Search .......... 365/189, 203, 206, 207, 365/208, 230
[56] References Cited
  U.S. PATENT DOCUMENTS
  4,339,809  7/1982  Stewart ....................... 365/206
  4,573,147  2/1986  Aoyama et al. ............. 365/230
  4,701,889 10/1987  Ando ............................ 365/230
  4,716,550 12/1987  Flannagan et al. .......... 365/207

Primary Examiner—Joseph A. Popek
Attorney, Agent, or Firm—Hill, Van Santen, Steadman & Simpson

[57] ABSTRACT

A semiconductor memory device, which can be maintained free from malfunction despite generation of current noise due to output signal variation in a output buffer circuit, is equipped with a switch in the input stage of the output buffer circuit, and the switch is so controlled as to be turned off during the period of time in which there exists the possibility that the output signal of the output buffer circuit may be changed by an address variation resulting from any current noise generated by variation in the output signal of the output buffer circuit.

13 Claims, 4 Drawing Sheets

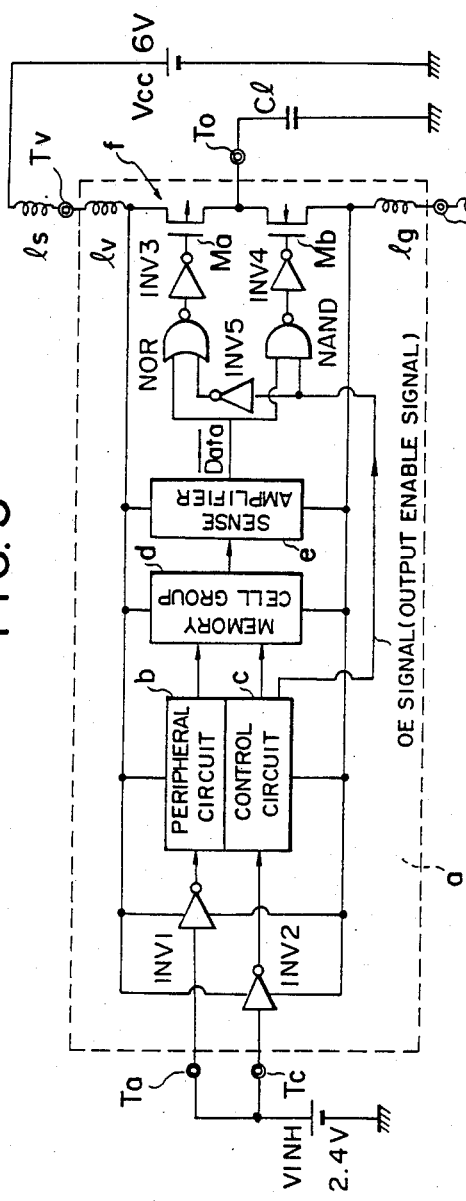
FIG. 5
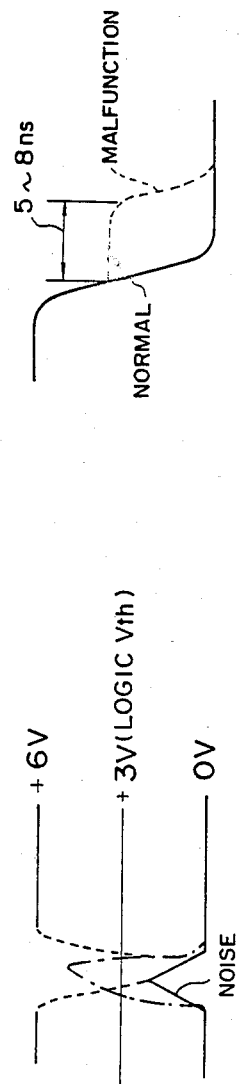
FIG. 6
FIG. 7

SEMICONDUCTOR MEMORY DEVICE

BACKGROUND OF THE INVENTION

1. Field of the Invention

The present invention relates to a semiconductor memory device and, more particularly, to a memory device capable of preventing malfunction that may be caused by noise resulting from variation in the output signal of an output buffer circuit.

2. Background of the Invention

FIG. 5 is a circuit block diagram schematically showing the circuit configuration of a conventional semiconductor memory device a, which includes an address terminal Ta for receiving an address signal, a control signal, an inverter circuit INV1 serving as an address input buffer circuit to receive an address signal and feeding its output to a peripheral circuit b, and another inverter INV2 serving as an input buffer circuit to receive a control signal and feeding its output to a control circuit c.

There are also shown a memory cell group d, a sense amplifier e for amplifying storage data read out from the memory cell, and an output buffer circuit f for receiving the output signal of the sense amplifier e. The buffer circuit f comprises a CMOS inverter consisting of a P-channel MOS FET Ma and an N-channel MOS FET Mb, inverters INV3 and INV4 forming input circuits thereto, a nor circuit NOR, a nand circuit NAND and an inverter INV5. Denoted by To is an output terminal of the output buffer circuit f.

The nand circuit NAND receives at its one input terminal an OE (output enable) signal from the control circuit c while receiving at its other input terminal a data signal from the sense amplifier e. The nr circuit NOR receives at its one input terminal a signal obtained by inverting the OE signal of the control circuit c through the inverter INV5 while receiving at its other input terminal the data signal from the sense amplifier e. The output signal of the nor circuit NOR is inverted through the inverter INV3 and then is applied to the gate of the P-channel MOS FET Ma, while the output signal of the nand circuit NAND is inverted through the inverter INV4 and then is applied to the gate of the N-channel MOS FET Mb. To the output terminal To of the memory is connected a TTL or similar logic circuit. Denoted by Cl is the capacity of a load.

There are further included a power terminal Tv of the memory a and a ground terminal Tg thereof, wherein a supply voltage Vcc of, for example, 6 V is applied between the power terminal Tv and the ground terminal Tg.

Also shown are an inductance ls (10 nH) resulting from a socket of the memory a, an inductance lv (30 nH) existing on the ground side due to the ground lead frame and bonding wire. The existence of such inductances brings about a great problem, which will be described later in detail.

The present inventor proposed an improved circuit configuration previously, as disclosed in Japanese Patent Laid-open No. 61 (1986)-108223, wherein one of drive transistors in the final stage of an output buffer circuit is connected to a diode merely for a predetermined period of time and then is switched over to a conventional connection by the use of a delay circuit to consequently reduce current noise.

In the semiconductor memory a shown in FIG. 5, noise is generated in the ground line of power supply line by the operation of the output buffer circuit f and causes malfunction of the inverter circuit INV1 to induce an address variation, which eventually varies the output signal of the output buffer circuit f. This problem will now be described below more specifically. In the output buffer circuit f supplied with a voltage Vcc of 6 V, its "high" output voltage is 6 V while its "low" output voltage is 0 V. In contrast to 3 V, which is one half of the supply voltage Vcc, generally a TTL circuit connected to the output side of the semiconductor memory a has a logic threshold voltage of 1.5 V. Therefore, the output voltage of the output buffer circuit f turns from "low" to "high" when rising about 1.5 V from 0 V. Meanwhile the output voltage of the output buffer circuit f turns from "high" to "low" when falling below 1.5 V after a drop of 4.5 V from 6 V. Thus, the time required for obtaining a readable state is prone to be longer in the case of a voltage change from "high" to "low". In order to raise the reading speed by minimizing such required time, it is necessary to enhance the driving capability of the MOS FET Mb for increasing the discharge current of the load capacity Cl to cause fast discharge. Particularly when the ports connected to the output buffer circuit f are numerically great, it is necessary to increase the discharge current. However, if such discharge is executed fast, a counterelectromotive force is generated due to the aforementioned parasitic inductances lg and ls, so that the ground line comes to have a level higher than the intrinsic ground level by a value corresponding to the counterelectromotive force. And such higher-level voltage appears in the form of noise having an amplitude of 2 V or so as shown by a solid line in FIG. 6. This noise exerts considerable effect on the operation of the inverter circuit INV1 because of the following reason. A "high" voltage VINL of the address signal is 2.2 V (while a "low" voltage VINL of the input address signal is 0.8 V). And the former stage of the memory a consisting of a TTL circuit similarly to the latter stage needs to be capable of processing the input address signal of 2.2 V as a "high" signal. However, since the aforementioned counterelectromotive force causes a transient state where a noise source is inserted between the intrinsic ground and the ground in the semiconductor memory a, the address signal of 2.2 V is received and processed as a "low" signal. That is, even when the potential at the gate of an unshown groundside MOS FET in the inverter circuit INV1 is 2.2 V, its source potential actually reaches 2 V or so due to the noise and further there exists a threshold voltage of IV or more of the MOS FET itself, so that the gate-source voltage becomes lower than the threshold voltage and therefore it fails to conduct when conduction is necessary. Consequently the output voltage of the inverter INV1 comes to exceed the logic threshold level of the next-stage circuit due to the noise as shown by a one-dot chain line in FIG. 6. As a result, the level of the next-stage circuit, of which "high" output voltage should be 6 V, falls to the vicinity of 0 V as shown by a broken line in FIG. 6. Such noise is termed current noise which causes transient malfunction of the inverter INV1. This signifies that an address variation is induced by the noise. And the read data content is rendered different by such address variation to eventually bring about transient malfunction of the output buffer circuit f as well. Accordingly, there may occur a phenomenon of oscillation as represented by broken lines in FIG. 8.

Assuming now that there is no problem of such current noise, in case the level of the read data signal $\overline{\text{Data}}$ turns from "low" to "high" as shown by a solid line in FIG. 8, the output signal Out of the output buffer circuit f also turns to a "low" level in response thereto as shown by the solid line. And thereafter the read data signal $\overline{\text{Data}}$ and the output signal Out of the output buffer circuit f are supposed to remain unchanged until a different address is accessed and the content of the read data signal $\overline{\text{Data}}$ is changed.

However, when the output signal Out is changed by a change in the read data signal $\overline{\text{Data}}$ (change not relevant to malfunction), the aforementioned current noise is generated by such change in the output signal Out to consequently bring about malfunction that the address is temporarily varied. And such temporary address variation causes a change of the read data signal $\overline{\text{Data}}$ as shown by a broken line. Then the output signal Out is also change correspondingly to generate current noise, which brings about a temporary address variation to eventually change the read data signal $\overline{\text{Data}}$ as well. Thus, as mentioned above, there occurs a phenomenon of oscillation shown by a broken line in FIG. 8.

Upon variation of the address signal due to generation of the current noise, an equalizing address transition pulse is produced to perform equalization so that, during reading the output signal Out, a transiently unstable state is induced by the equalization resulting from generation of the address transition pulse, whereby reading the signal may be rendered impossible.

Such current noise is generated not only when discharging the load capacity Cl but also when charging the same, i.e. at the rise of the output voltage from "low" to "high".

The malfunction described above can be eliminated by preventing generation of current noise. However, in the case of a high-speed static RAM (SRAM) or the like, the speed of discharging or charging the load capacity Cl needs to be increased to enhance the driving capability of the output buffer circuit, whereby generation of current noise is rendered unavoidable.

SUMMARY OF THE INVENTION

The present invention has been accomplished in view of the circumstances mentioned above. And its object is to provide an improved semiconductor memory device which can be maintained free from malfunction despite generation of any current noise.

For the purpose of solving the above problems, the semiconductor memory device of the present invention is equipped with switching means in the input state of the output buffer circuit, wherein the switching means is so contrived as to be turned off during the period of time in which there exists the possibility that the output signal of the output buffer circuit may be changed by an address variation resulting from any current noise generated by variation in the output signal of the output buffer circuit.

According to the semiconductor memory device of the present invention, no signal is fed to the current buffer circuit during the period of time in which the output signal of the output buffer circuit may possibly be changed by any current noise that is generated due to variation in the output signal of the output buffer circuit, so that despite generation of any current noise, the output signal of the output buffer circuit is never changed by such current noise.

BRIEF DESCRIPTION OF THE DRAWINGS

FIG. 5 is a circuit block diagram of a conventional memory device; and

FIGS. 6 through 8 explain the problems in the prior art in which FIG. 6 shows the output waveform of an inverter INV1, FIG. 7 shows the output waveform of an output buffer, and FIG. 8 shows the waveforms of a read data signal and an output signal of an output buffer circuit.

DETAILED DESCRIPTION OF THE PREFERRED EMBODIMENT

Hereinafter the semiconductor memory device of the present invention will be described in detail with reference to a preferred embodiment shown in the accompanying drawings.

Figure 1:
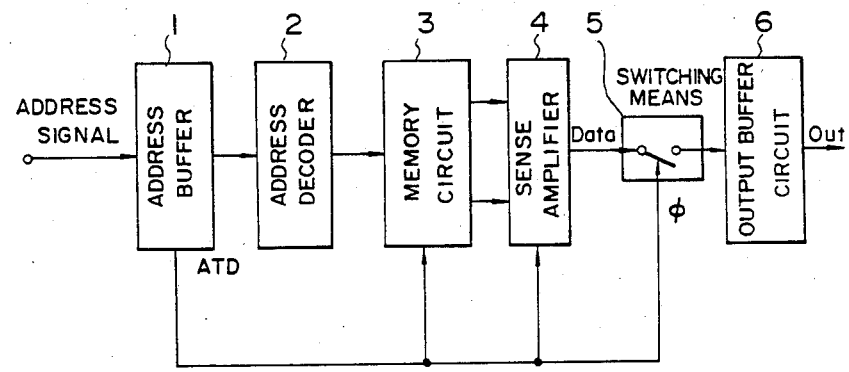
FIG. 1 is a functional block diagram of a semiconductor memory device embodying the present invention.

FIG. 1 is a circuit block diagram of an exemplary memory device embodying the present invention which comprises an address buffer, an address decoder 2, a memory circuit 3, a sense amplifier 4, a switching circuit 5 and an output buffer circuit 6.

In this memory device, the switching circuit 5 is disposed between the sense amplifier 4 and the output buffer circuit 6. The switching circuit 5 is controlled by an address transition pulse $\phi$ outputted from the address buffer 1, in such a manner as to be turned off at a "high" level of the address transition pulse $\phi$ corresponding to an address variation or to be turned on at a "low" level of the address transition pulse $\phi$.

Figure 2:
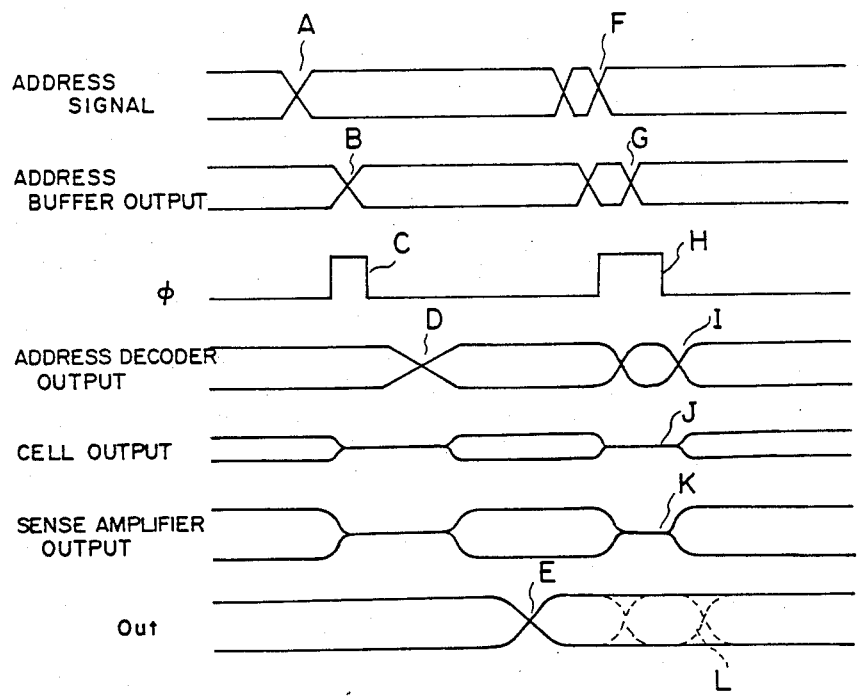
FIG. 2 is a timing chart of signals in the device of FIG. 1.

The operation will now be described below with reference to FIG. 2 which is a timing chart of signals.

Upon occurrence of a change in the address signal (as denoted by A), the output signal of the address buffer 1 is changed (as denoted by B) while an address transition pulse $\phi$ is generated (as denoted by C) and then is fed as an equalizing signal to both the memory circuit 3 and the sense amplifier 4. Accordingly, the memory cell output (bit line output) of the memory circuit 3 and the output of the sense amplifier 4 are equalized. The address transition pulse $\phi$ is also transmitted as a switching signal to the switching circuit 5, which is thereby turned off. However the action of turning off the switching circuit 5 is not so significant here.

Figure 8:
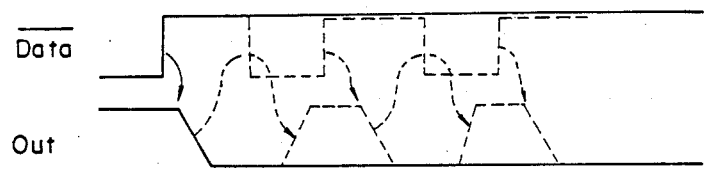

Thereafter (following the change in the output signal of the address buffer 1) the output signal of the address decoder 2 is changed (as denoted by D), so that the equalized outputs of the memory cell and the sense amplifier 4 are changed to consequently change the output signal of the output buffer circuit 6 as well, thereby completing production of the output with respect to a new address. However, since current noise is generated due to the change in the output signal of the output buffer circuit 6, as mentioned previously, a temporary variation occurs in the address signal (as denoted by F). Upon occurrence of such temporary address signal variation, the output signal of the address buffer 1 is also varied temporarily (as denoted by G). And such variation in the output signal of the address buffer 1 causes generation of an address transition pulse $\phi$ correspondingly (as denoted by H). The address transition pulse φ thus generated is then applied to the switching circuit 5, which is thereby maintained in its off-state during generation of the address transition pulse φ. Accordingly, the variation in the output of the sense amplifier 4 is blocked by means of the switching circuit 5 and is therefore not transmitted to the output buffer circuit 6 despite any variation induced in the output of the sense amplifier 4 (as denoted by K) due to the varied output of the memory cell (as denoted by J) resulting from the output signal variation of the address decoder 2 because of the address signal variation (F) caused by current noise. Thus, it becomes possible to avert variation (L) which may otherwise be induced in the output signal of the output buffer circuit 6 by any current noise. And when the normal state is resumed with extinction of the address transition pulse φ, the switching circuit 5 is turned on again. The turn-off period of the switching circuit 5 is on the order of nsec which is shorter than one half of the access time required for generation of an output signal after occurrence of an address signal variation. For example, the duration of such turn-off period ranges from 1 to 25 nsec. Since the turn-off period is so short and the input impedance of the MOS FET constituting the output buffer circuit 6 is high, the output signal of the output buffer circuit 6 remains unchanged regardless of turn-off of the switching circuit 5. Consequently the output signal Out of the output buffer circuit 6 can be maintained free from any variation that may otherwise be caused by current noise. As a result, it becomes possible to prevent a phenomenon of oscillation which takes place due to current noise as shown by a broken line in FIG. 8 and, if the memory circuit 3 or the sense amplifier 4 is placed in an equalized state by generation of an address transition pulse resulting from any current noise, the output buffer circuit 6 is protected from the harmful effect by means of the switching circuit 5. Accordingly the data can be read out from the memory device without any impediment.

The period of time, during which transmission of the output of the sense amplifier 4 to the output buffer circuit 6 is inhibited by turning off the switching circuit 5, corresponds to the length in which the output side of the output buffer circuit 6 is varied by the current noise generated due to the variation in the output signal Out of the output buffer circuit 6. And the operation of turning off the switching circuit 5 during such period can be usually performed by using the address transition pulse φ as a switching signal for the circuit 5. However, depending on the characteristics and so forth of the memory device, it becomes necessary to delay or prolong the turn-off period of the switching circuit 5. In such a case, a pulse delay circuit or a pulse prolong circuit may be provided, and the address transition pulse φ may be applied as a switching signal to the circuit 5 via the pulse delay or prolong circuit.

Figure 3:
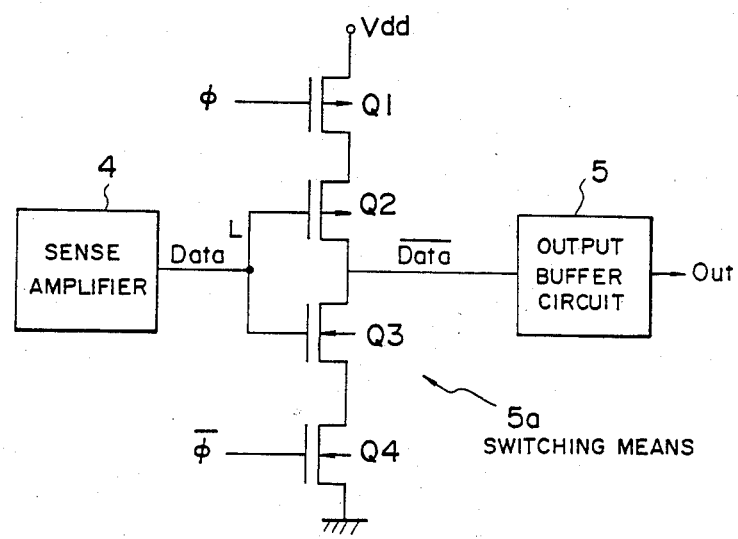
FIG. 3 is a circuit diagram of a first example of switching means.

FIG. 3 is a circuit diagram of a first example 5a of such switching circuit.

The switching circuit 5a consists of four series-connected MOS FETs Q1, Q2, Q3 and Q4, of which Q1 and Q2 are both P-channel MOS FETs, and Q1 receives an address transition pulse φ at its gate with a drain thereof connected to a power terminal Vdd. Meanwhile Q3 and Q4 are both N-channel MOS FETs, of which Q4 receives an inverted signal of the address transition pulse φ at its gate with a drain thereof grounded. The data signal from the sense amplifier 4 is applied to gates of the MOS FETs Q3 and Q4, and an inverted data signal is outputted from the interconnected sources of the MOS FETs Q2 and Q3.

Both MOS FETs Q1 and Q4 are turned off in response to the address transition pulse φ, and the output point (interconnected sources of Q2 and Q3) of the switching circuit 5a is placed in an electrically floating state to consequently prevent transmission of the data signal Data from the sense amplifier 4 to the output buffer circuit 5.

Figure 4:
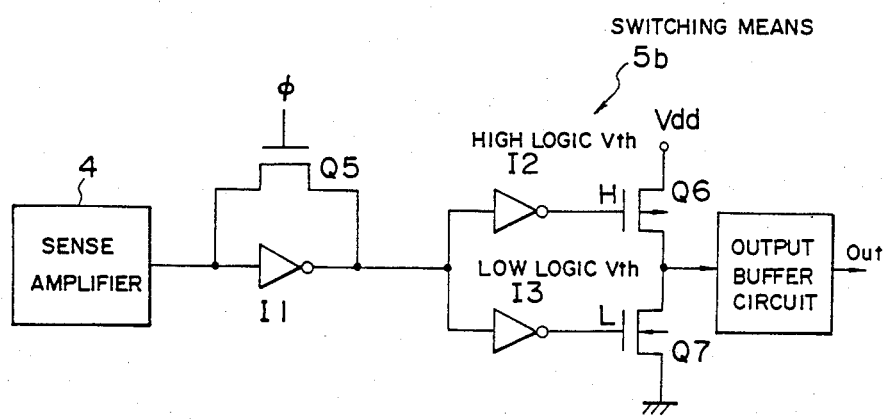
FIG. 4 is a circuit diagram of a second example of switching means.

FIG. 4 is a circuit diagram of a second example 5b of such switching circuit.

A CMOS inverter I1 is disposed to receive the output of a sense amplifier 4, and an equalizing MOS FET Q5 is connected between the input an output terminals of the inverter I1. Upon arrival of the address transition pulse φ at the gate, the MOS FET Q5 serves to short-circuit the input and output of the CMOS inverter I1, which is so designed that its output potential becomes an intermediate value Vm when the input and output thereof are short-circuited. Denoted by I2 is an inverter which receives the output signal of the CMOS inverter I1 and has a threshold level VthH higher than the aforesaid intermediate potential Vm. The output signal fo the inverter I2 is connected to the gate of a MOS FET Q6 constituting a CMOS inverter. Another inverter I3 receives the output signal of the CMOS inverter I1 at its gate and has a threshold level VthL lower than the aforesaid intermediate potential Vm. The output signal of the inverter I3 is fed to the MOS FET Q6 and then is applied to the gate of a MOS FET Q7 constituting the aforesaid CMOS inverter.

When the MOS FET Q5 is turned on by the address transition pulse φ in such switching circuit 5b the input and output of the inverter I1 is short-circuited so that the output potential thereof becomes its intermediate value Vm. Then the output signal of the inverter I2 turns to "low" while that of the inverter I3 to "high". Consequently the MOS FETs Q6 and Q7 constituting the CMOS inverter are both turned off, so that the output terminals thereof are placed in an electrically floating state.

Upon arrival of the address transition pulse φ, the switching circuit 5b functions to inhibit transmission of the data signal from the sense amplifier 4 to the output buffer circuit 6.

Although the known circuit configuration disclosed in Japanese Patent Laid-open No. 60 (1985)-119698 is similar to that of the present invention, there exist wide differences therebetween with respect to both purpose and operation. In the above known device, a switch is turned on immediately before feeding a drive signal to an output buffer circuit and, after the output state is rendered steady, the switch is turned off and then the output signal is held by a stable latch output.

As described hereinabove, according to the semiconductor memory device of the present invention, switching means is disposed in the input stage of an output buffer circuit and is so controlled as to be turned off during the period of time in which there is the possibility that the output signal of the output buffer circuit may be changed by harmful effect of noise resulting from any variation in the output signal of the output buffer circuit.

Consequently, no signal is fed to the output buffer circuit during the period of time in which the output signal of the output buffer circuit may possibly be changed by any current noise that is generated due to variation in the output signal of the output buffer circuit, so that despite generation of any current noise, the output signal of the output buffer circuit is maintained free from change. Thus, malfunction of the output buffer circuit can be eliminated eventually in the memory device regardless of generation of any current noise.

While an exemplary embodiment of the present invention has been described hereinabove, it will be apparent to those skilled in the art that various minor modifications may be made therein without departing from the spirit and scope of the invention as claimed.

What is claimed is:

1. A semiconductor memory device comprising:
   an address buffer circuit for producing an output signal in response to an address signal and for producing an address transition pulse by detecting a transition of the address signal;
   an address decoder connected to said address buffer circuit for producing a memory-cell specifying signal in response to the output signal of said address buffer circuit;
   a memory circuit connected to said address decoder for outputting data from a specified address in response to said specifying signal;
   a sense amplifier connected to said memory circuit for producing an amplified signal in response to the data from said memory circuit;
   an output buffer circuit connected to said sense amplifier for producing an output signal in response to said amplified signal; and
   a switch interposed between said sense amplifier and said output buffer circuit and connected to receive said transition pulse, said switch being adapted to be turned off for a predetermined period of time in response to said transition pulse obtained from said address buffer circuit by detecting a transition of the address signal;
   said period being less than ½ the time required for generation of an output signal from said memory circuit after an address signal variation.

2. The memory device as defined in claim 1, including means connecting said address transition pulse from said address buffer circuit to said memory circuit.

3. The memory device as defined in claim 1, including means for supplying said address transition pulse to a bit line of said memory circuit, wherein by said bit line of said memory circuit is equalized by the address transition pulse.

4. The memory device as defined in claim 1, including means for connecting said address transition pulse to said sense amplifier.

5. The memory device as defined in claim 4, including equalizing means, whereby the output of said sense amplifier is equalized by said address transition pulse.

6. The memory device as defined in claim 1, including means for connecting said address transition pulse to both said memory circuit and said sense amplifier.

7. The memory device as defined in claim 6, wherein said transition pulse is connected to the bit line of said memory circuit, whereby said bit line and the output of said sense amplifier are equalized by the address transition pulse.

8. The memory device as defined in claim 1, wherein said switch means incorporates means for turning off said switch in response to said transition pulse corresponding to a time during which the outputs of said address buffer circuit, address decoder, memory circuit and sense amplifier are varied by an address signal variation resulting from noise due to a variation in the output signal of said output buffer circuit.

9. The memory device as defined in claim 1, wherein said switch has a turn-off period which is shorter than one half of the access time required for generation of an output signal after occurrence of an address signal variation.

10. The memory device as defined in claim 1, wherein the turn-off period of said switch ranges from 1 to 25 nsec.

11. The memory device as defined in claim 1, wherein said memory circuit incorporates memory cells composed of flip-flop circuits and switching transistors.

12. The memory device as defined in claim 1, wherein said switch consists of four series-connected MOS FETs of which the first and second are P-channel type while the third and fourth are N-channel type, and the first MOS FET is connected to receive the address transition pulse at its gate with a drain thereof connected to a power terminal, while the fourth MOS FET is connected to receive an inverted signal of the address transition pulse at its gate with a drain thereof grounded.

13. The memory device as defined in claim 1, wherein said switch consists of a first CMOS inverter responsive to the output signal of said sense amplifier and providing an intermediate output potential when the input and output thereof are short-circuited, an equalizing first MOS FET connected between the input and output of said first CMOS inverter, a second CMOS inverter responsive to the output signal of said first CMOS inverter at its gate and having a logic threshold level higher than said intermediate potential, a second MOS FET responsive to the output signal of said second inverter at its gate, a third inverter responsive to the output signal of said first CMOS inverter at its gate and having a logic threshold level lower than said intermediate potential, and a third MOS FET connected to said second MOS FET and responsive to the output signal of said third inverter at its gate.

* * * * *